(12) United States Patent
Noorlag

(10) Patent No.: US 8,644,083 B2
(45) Date of Patent: Feb. 4, 2014

(54) DEGRADATION EQUALIZATION FOR A MEMORY

(75) Inventor: Date Jan Willem Noorlag, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/523,555

(22) Filed: Jun. 14, 2012

(65) Prior Publication Data

US 2012/0250439 A1    Oct. 4, 2012

Related U.S. Application Data

(62) Division of application No. 12/609,504, filed on Oct. 30, 2009, now Pat. No. 8,218,380.

(51) Int. Cl.
*G11C 7/10* (2006.01)
*G11C 7/00* (2006.01)

(52) U.S. Cl.
USPC ........... 365/189.011; 365/189.15; 365/189.16

(58) Field of Classification Search
USPC .................. 365/189.011, 189.15, 189.16
See application file for complete search history.

(56) References Cited

U.S. PATENT DOCUMENTS

| | | | |
|---|---|---|---|
| 5,646,903 A * | 7/1997 | Johnson | 365/230.05 |
| 5,896,335 A * | 4/1999 | Myers et al. | 365/203 |
| 6,021,085 A * | 2/2000 | Goto | 365/230.03 |
| 6,762,961 B2 | 7/2004 | Eleyan et al. | |
| 6,888,766 B2 | 5/2005 | Takahashi | |
| 7,170,812 B2 * | 1/2007 | Nii | 365/227 |
| 7,447,054 B2 | 11/2008 | Abella et al. | |
| 7,545,666 B2 | 6/2009 | Chang | |
| 7,576,433 B2 | 8/2009 | Ishino et al. | |
| 7,577,015 B2 * | 8/2009 | Abella et al. | 365/154 |
| 7,577,028 B2 | 8/2009 | Dover | |
| 7,990,796 B2 | 8/2011 | Brown | |
| 2003/0016562 A1 | 1/2003 | Im | |
| 2003/0117856 A1 | 6/2003 | Lee et al. | |
| 2005/0078519 A1 | 4/2005 | Shiga | |
| 2007/0280031 A1 | 12/2007 | Maejima et al. | |
| 2008/0101131 A1 | 5/2008 | Lee et al. | |
| 2009/0091991 A1 * | 4/2009 | Cho et al. | 365/189.16 |
| 2009/0237979 A1 | 9/2009 | Mukai et al. | |

* cited by examiner

*Primary Examiner* — Ly D Pham
(74) *Attorney, Agent, or Firm* — Lawrence J. Merkel; Meyertons, Hood, Kivlin, Kowert & Goetzel, P.C.

(57) ABSTRACT

In an embodiment, an integrated circuit includes a memory and a control circuit configured to cause an inversion of at least a portion of the data stored in the memory to more evenly balance the amount of time that a given memory cell in the memory stores a binary one or a binary zero. In some implementations, the inversion may be controlled for the memory as a whole via a global indication. In other implementations, data may be inverted on a row-by-row or column-by-column basis. In other embodiments, the global indication may be changed at each boot of a device including the integrated circuit.

19 Claims, 5 Drawing Sheets

DEGRADATION EQUALIZATION FOR A MEMORY

This application is a divisional of U.S. patent application Ser. No. 12/609,504, filed Oct. 30, 2009, now U.S. Pat. No. 8,218,380, incorporated herein by reference in its entirety.

BACKGROUND

1. Field of the Invention

This invention is related to the field of integrated circuits and, more particularly, memories included in integrated circuits.

2. Description of the Related Art

As the size of various transistor features continue to be reduced from generation to generation of semiconductor manufacturing processes, issues related to the aging of transistors increase in importance. Typically, the effects of aging over a defined lifetime for an integrated circuit (e.g. 5 years) are accounted for by adding additional margin into the supply voltage required to power the integrated circuit (increasing the magnitude of the supply voltage above the minimum at which the integrated circuit could theoretically operate).

One such aging effect is negative bias temperature instability (NBTI). NBTI primarily affects P-type metal-oxide-semiconductor (PMOS) transistors, and causes the threshold voltage of the transistors to increase in magnitude over time. The transistors thus turn on more slowly in response to changes in gate to source voltage, slowing down overall operation of the circuit.

NBTI is of particular concern in the memory array cells. The memory array cells include PMOS transistors, one of which is active at a given point in time retaining a binary one ($V_{DD}$ voltage level) on one of the two nodes of the memory array cell (either the true or complement node in the memory cell). In order to provide reliable storage, the cells are designed to be symmetrical. If symmetry is lost, reliability in the cell decreases. If NBTI effects to the PMOS transistors in the cell are unequal, the symmetry of the memory cell can be lost. Early failure of the integrated circuit can result.

SUMMARY

In an embodiment, an integrated circuit includes a memory and a control circuit configured to cause an inversion of at least a portion of the data stored in the memory for periods of time to more evenly balance the amount of time that a given memory cell in the memory stores a binary one or a binary zero. In some implementations, the inversion may be controlled for the memory as a whole via a global indication. That is, the memory may store all inverted data or all non-inverted data. In other implementations, data may be inverted on a row-by-row or column-by-column basis. The control circuit may be configured to measure an interval of time to control when inversions are performed, or may measure the frequency of writes to the memory to determine when inversion is to be performed. In other embodiments, the global indication may be changed at each boot of a device including the integrated circuit. Numerous embodiments are contemplated in which data stored in the memory is inverted to balance the aging effects on the transistors in the memory.

In an embodiment, more evenly balancing the amount of time that a given memory cell stores a binary zero and a binary one may tend to equalize the degradation of the transistors in the memory cell over time. The symmetry of the memory cell may be more likely to be preserved, which may improve the lifetime of the memory circuit and thus the lifetime of the integrated circuit that includes the memory, in some embodiments.

BRIEF DESCRIPTION OF THE DRAWINGS

The following detailed description makes reference to the accompanying drawings, which are now briefly described.

Figure 1:
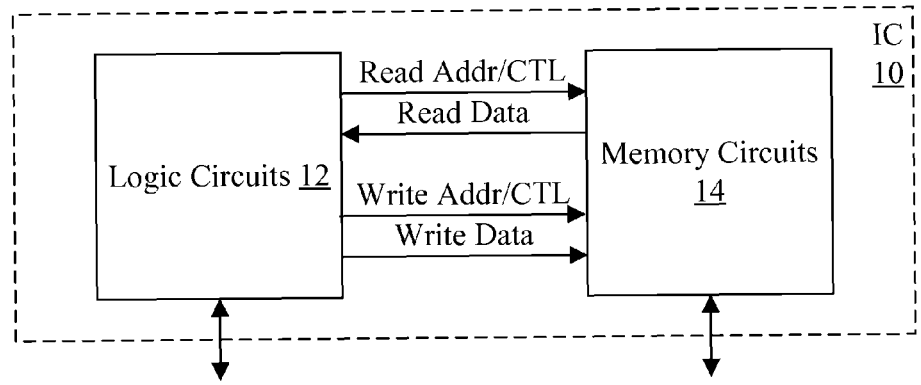
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit (IC) 10 is shown. In the illustrated embodiment, the integrated circuit includes a plurality of logic circuits 12 and a plurality of memory circuits 14. The logic circuits 12 are coupled to the memory circuits 14. Specifically, the logic circuits 12 may be coupled to one or more read ports and one or more write ports to the memory circuits 14. Each read port may include an address/control input (Read Addr/CTL in FIG. 1) and a read data output (Read Data in FIG. 1). Each write port may include an address/control input (Write Addr/CTL in FIG. 1) and a write data input (Write data in FIG. 1). Some memory circuits 14 may also include control signal outputs. For example, a memory circuit 14 that is used as a cache may output hit/miss, cache coherence state, etc. The integrated circuit 10 may generally comprise the logic circuits 12 and the memory circuits 14 integrated onto a single semiconductor substrate (or chip). One or both of the logic circuits 12 and the memory circuits 14 may be configured to communicate with other components external to the IC 10. The IC 10 may include interface circuitry (not shown in FIG. 1) configured to implement the protocols and timing of external interface communications.

The logic circuits 12 may generally implement the operation for which the integrated circuit is designed. The logic circuits 12 may generate various values during operation, which the logic circuits 12 may store in (or write to) the memory circuits 14. Additionally, the logic circuits 12 may read various values on which to operate from the memory circuits 14. For example, in some embodiments, the logic circuits 12 may include one or more processors configured to execute instructions, wherein the processors may generate and/or consume values stored in the memory circuits 14. In various embodiments, the memory circuits 14 may include memory used for caches, register files, integrated-circuit-specific data structures, etc. The memory circuits 14 may implement any type of readable/writeable memory. In an example below, a static random access memory (SRAM) will be used. It is noted that, while the illustrated embodiment includes a plurality of logic circuits 12 and a plurality of memory circuits 14, various embodiments may include at least one logic circuit 12 and at least one memory circuit 14.

There is no guarantee, in general, that the data generated by the logic circuits 12 will include equal distributions of binary zeros and binary ones over time. Thus, it is possible that one or more memory cells in the memory circuits 14 may store binary zeros much more frequently than binary ones, or vice versa. Tag memories for caches may be particularly susceptible to these effects, in some embodiments. For example, valid bits may be set most of the time, most significant address bits may frequently be zero (e.g. if memory system that does not span the entire memory address space is included in a system that implements the IC 10), etc.

In order to combat these effects, one or more of the memory circuits 14 may be configured to periodically invert the data stored in the memory cells (or a subset of the memory cells). For memory cells that frequently store the same value, inverting the data stored in these memory cells may make the time spent storing a binary one and the time spent storing a binary zero more equal. The degradation of the transistors in the memory cells (e.g. the NBTI effects in the PMOS transistors) may be more equal, which may help preserve the symmetry of the memory cells. The lifetime of the memory circuits 14 may be improved, which may improve the overall lifetime of the IC 10.

Generally, if a logic circuit 12 is to access a memory circuit 14, the logic circuit 12 may generate accesses on the ports to the memory circuit 14. For example, a read may be transmitted on a read port including the address, a read enable signal, size information, etc. The memory circuit 14 may output data on the read data portion of the read port. A write may be transmitted on a write port including the address, a write enable, signal, size information, etc. along with the write data. The memory circuit 14 may write the write data to the addressed location. While read and write ports are illustrated and discussed herein, it is noted that a given port may be a read/write port that may be used to perform a read access or a write access.

Figure 2:
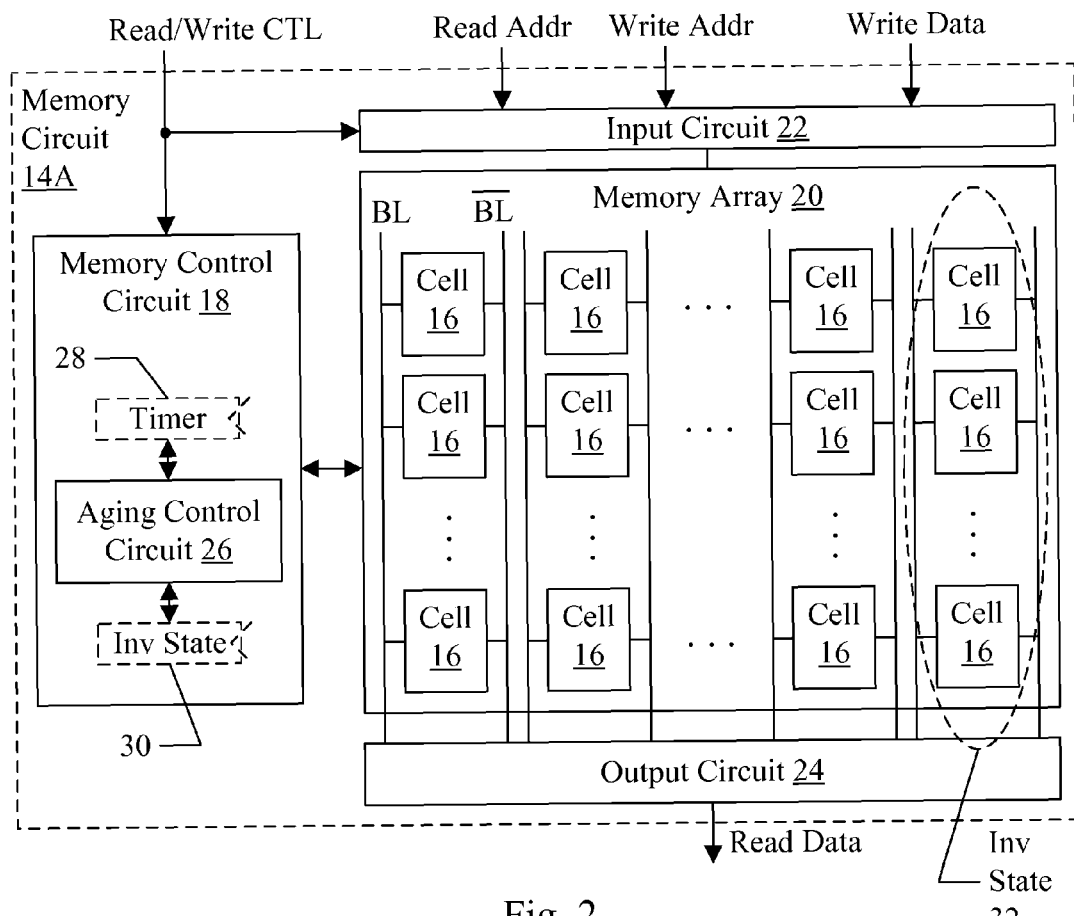
FIG. 2 is a block diagram of one embodiment of a memory circuit illustrated in FIG. 1.

Turning now to FIG. 2, a block diagram of one embodiment of a memory circuit 14A is shown. Other memory circuits 14 in the integrated circuit 10 may be similar. In the illustrated embodiment, the memory circuit 14A includes a memory control circuit 18, a memory array 20, a input circuit 22, and an output circuit 24. The memory control circuit 18 is coupled to the memory array 20 and is coupled to receive the Read/Write control inputs corresponding to each read and write port. The input circuit 22 is coupled to the memory array 20 and is coupled to receive the read/write control inputs, the read addresses for each read port, the write addresses for each write port, and the write data for each write port. The output circuit 24 is coupled to the memory array 20 and to provide read data for each read port. The memory control circuit 18 may include an aging control circuit 26 and optionally one or both of a timer in a register 28 and a inversion state (Inv state) in a register 30 to which the aging control circuit 26 may be coupled.

The memory array 20 includes memory cells 16 arranged into rows and columns of cells. A given row of the memory array 20 is selected in response to an input address on a read or write port, and the memory cells 16 in that row, collectively, store the bits of data that form the value read from/written to that row. Each column of memory cells 16 may correspond to a particular bit position in each row. Since one row may be selected for a given read/write, a set of bit lines to convey data into/out of the memory cells 16 may be shared by the cells of a column. In the case that multiple read ports or write ports are provided, separate sets of bit lines may be coupled to each column of the memory cells 16 for each port. For simplicity in this disclosure, one port will be described in more detail herein. However, various embodiments may include any number of ports, as desired.

A memory cell 16 may comprise any circuitry configured to accept a bit written to the cell, and to reliably store the bit and provide the bit in response to a read of the memory cell 16 until another bit value is written to the cell. For example, an SRAM memory cell 16 may comprise a pair of cross-coupled inverters (the output of each inverter is coupled to the input of the other inverter) along with pass gate transistors that couple the nodes of the memory cell to the bit lines. Other circuitry may be used in other embodiments. The bit lines in the illustrated embodiment comprise a bit line (BL in FIG. 2) and a bit line bar (BL with a bar over it in FIG. 2). The value read from a memory cell 16 may be represented by a differential between the voltages on bit line and bit line bar. If the bit line voltage is greater than the bit line bar voltage, a binary one is read from the memory cell. If the bit line voltage is less than the bit line bar voltage, a binary zero is read from the memory cell 16. Write operations may be accomplished by driving the bit line and bit line bar signals to voltages that represent the bit being written.

The aging control circuit 26 may be configured to control the inversions of data stored in the memory array 20 and/or the correction of data being read from the memory array 20 when inverted data is stored therein. Generally, a given memory cell 16 may be storing data in its "true form", in which the bit read from the memory cell 16 onto the bit lines coupled to that memory cell is the correct binary value of the bit, or in its "complement form", in which the bit read from the member cell 16 is the opposite binary value of its bit. Viewed in another way, a memory cell 16 may store the bit corresponding to the bit position of the value stored in the memory location, or may store the inverse of the bit.

In various embodiments, the inversion may be controlled in a variety of fashions. For example, the inversion may be performed globally for the memory array 20. That is, all memory cells 16 in the memory array 20 may store data in complement form or true form, dependent on a global inversion state for the memory array 20. In such an embodiment, the global inversion state may be stored in the register 30. Based on the inversion state, the data written to the memory array 20 may be inverted to be stored in complement form, and data read from the memory array 20 may be inverted to be supplied as read data.

Figure 5:
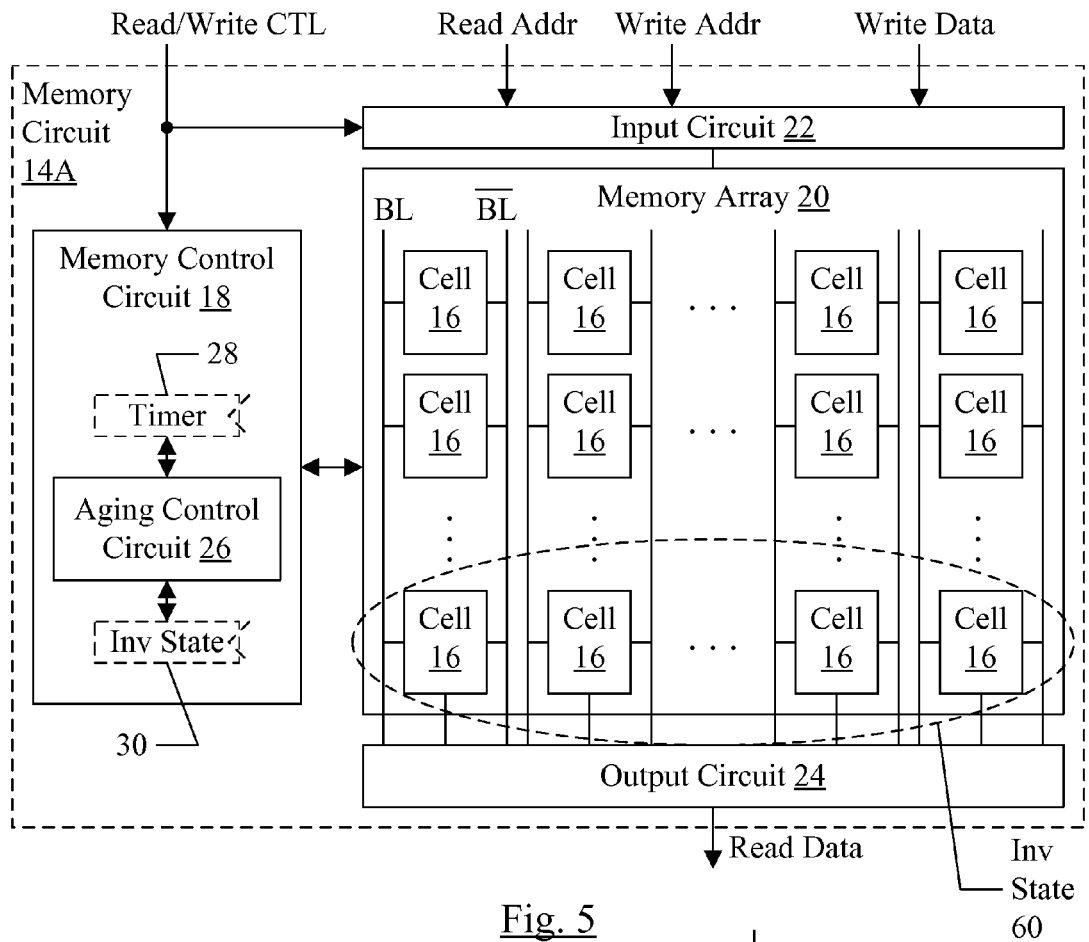
FIG. 5 is a block diagram of another embodiment of a memory circuit illustrated in FIG. 1.

In other embodiments, a portion of the data in the memory array 20 may be stored in complement form and the remaining portion may be stored in true form. For example, in the illustrated embodiment, each row of the memory array 20 may be stored in either true or complement form. Each row may include an additional memory cell 16 to store the inversion state for that row. Thus, an additional column for the inversion state may be included, illustrated as the inversion state column 32 in FIG. 2. The inversion state for a row may be written when the row is written, and may be read when the row is read. The inversion state may control the correction of read data for a read. In another embodiment, data may be inverted on a column-by-column basis as illustrated in FIG. 5 and discussed in more detail below. Additionally, some embodiments may store a per-row or per-column inversion state in the register 30 rather than as an additional column or row of the memory array 20.

In some embodiments, the aging control circuit 26 may determine when to cause inversions of data in the memory array 20. The aging control circuit 26 may measure an interval of time, and may cause inversion at the expiration of the interval. In some cases, the interval may be measured using the timer in the register 28. In the case of a global inversion state in the register 30, the aging control circuit 26 may modify the stored inversion state and may cause the data in the memory array 20 to be inverted (e.g. via a read-modify-write of each memory location or using embedded circuitry in the memory cells 16, in various embodiments). In the case that each memory location is separately inverted, the aging control circuit 20 may cause an inversion of one row in the memory array 20 in response to the interval expiring. For example, the aging control circuit 20 may track the most recent row to have been inverted, and may select the next row at the expiration of the interval. Similarly, for embodiments in which inversion is caused on a column-by-column basis, the aging control circuit 26 may track the most recent column to have been inverted, and may select the next column for inversion at the end of the interval.

The interval may be any amount of time. For example, the interval may be on the order of one or more hours of operation; once per day; once per a selected number of days, etc. Additionally, an embodiment is contemplated in which the inversion state is changed once per power-up initialization (or "boot") of the device that includes the IC 10. For example, a non-volatile memory location may store the most recent inversion state, and the instructions which execute during boot may modify the inversion state in the non-volatile memory and write the modified state to the register 30. Accordingly, in general, the inversion state for a given memory array may be recorded in the integrated circuit 10. The recording may be performed via the boot code executing and writing the register 30, via hardware update of the register 30, and/or via update of the inversion state for a row or column.

In some embodiments, the memory control circuit 18 may monitor the "busyness" of the memory circuit 14A. The busyness may be measured in terms of the frequency of write accesses to the memory. A busier cache, with more frequent write accesses, may be more likely to naturally balance the time that a binary one is stored in a given memory cell 16 as compared to a binary zero. In such embodiments, the interval measured by the timer in the register 28 may be reset in response to the busyness reaching a threshold, extending the interval until the memory is less busy.

The input circuit 22 may be configured to decode the input addresses to select a row of the memory array 20 for a read or write operation. The decode may result in the assertion of a word line to the row of memory cells that is selected for the address (not shown in FIG. 2). The input circuit 22 may further include write driver circuitry to drive write data on the bit lines to the memory cells 16. In an embodiment, the write driver circuitry may also invert the data to be written, if the row is to store data in complement form.

The output circuit 24 may include sensing circuitry such as sense amplifiers (sense amps) to sense the differential on the bit lines from a column to determine the read bit from that column. The output circuit 24 may also invert the read data responsive to either the inversion state in the register 30 or the inversion state read from the inversion state column 32 for the row. The (possibly inverted) data from the memory array 20 may be transmitted as the read data from the output circuit 24.

It is noted that, while the input circuit 22 and the output circuit 24 are illustrated separate from the memory array 20, these circuits may be an integrated part of the memory 20 in some implementations. It is further noted that, while registers have been used as an example in the above discussion, any clocked storage device may be used. For example, flops, latches, registers, etc. may be used in various embodiments.

The memory array 20 has been described as having rows and columns of memory cells 16, where the row is selected in response to an input address to the memory array 20. Generally, the memory array 20 may be viewed as having two dimensions. The inversion state for one of the dimensions may be stored in a set of memory cells in the other dimension (e.g. the inversion state column 32 in FIG. 2, storing the inversion state for each row of the memory array 20 or the inversion state row illustrated in FIG. 5).

The memory array 20 has been described as storing data. In this context, data may broadly encompass any bits which are stored in a memory. Thus, a cache may have a tag memory storing tag bits (address bits, state bits, etc.) and a data memory storing the corresponding cache block of data for each tag. Data may generally include the tag bits, and the cache block data bits.

It is noted that, while some embodiments may implement a global inversion state and other embodiments may implement a row-by-row or column-by-column inversion state, other embodiments may support both. For example, software may select whether to use a global inversion state or a row-by-row or column-by-column inversion state.

Figure 3:
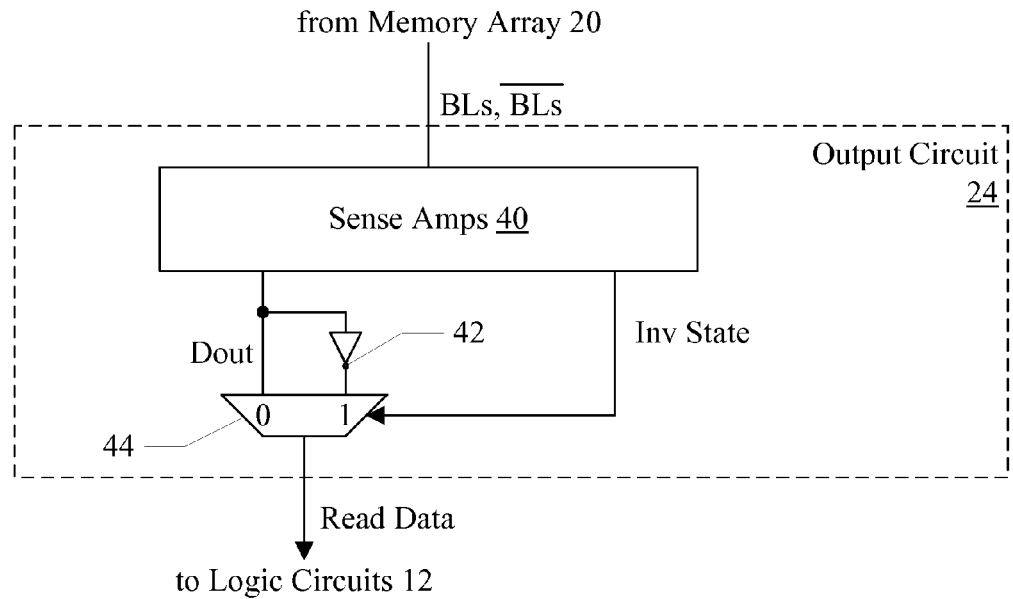
FIG. 3 is a block diagram of one embodiment of an output circuit shown in FIG. 2.

Turning now to FIG. 3, a block diagram of one embodiment of a portion of the output circuit 24 is shown. The output circuit 24 may include sense amps 40, inverters 42, and a multiplexor (mux) 44. The sense amps 40 may be coupled to receive the bit line and bit line bar from the columns of the memory array 40 (including the inversion state column 32). The sense amps are configured to output the data (Dout) to the "0" input of the mux 44 and to the input of the inverters 42. There may be one inverter per bit of Dout. The output of the inverters 42 is coupled to the "1" input of the mux 44, which is coupled to provide the read data output to the logic circuits 14. The inversion state captured from the inversion state column 32 is provided as the selection control in FIG. 3.

Accordingly, in the illustrated embodiment, if the inversion state indicates that the row of data is inverted (e.g. the inversion state is a binary one in this embodiment), the mux 44 may be configured to output the inverted data from the inverters 42, correcting the complement form of the data read from the memory array 20 to the true form. If the inversion state indicates that the row of data is not inverted (e.g. the inversion state is a binary zero in the embodiment), the mux 44 may be configured to output the Dout data. In embodiments in which a global inversion state is maintained for the memory array 20, the input to the mux 44 may be supplied from the register 30 rather than from the sense amps 40. In an embodiment, the write drivers in the input circuit 22 may implement a similar structure for input data (receiving data in, inverting the data using a set of inverters similar to inverters 42, and selecting true or complement form to be written to memory based on the inversion state).

In some embodiments, the data read from the memory array 20 may be shifted and/or masked. For example, when a cache block or portion thereof is read from a cache data memory, the data may be shifted and/or masked to present the data within the block that is requested by the source of the read access within the logic circuits 14, based on the size information, least significant bits of the address, etc. The mux 44 may be integrated into the mux circuitry that performs the shifting, in such embodiments.

Figure 4:
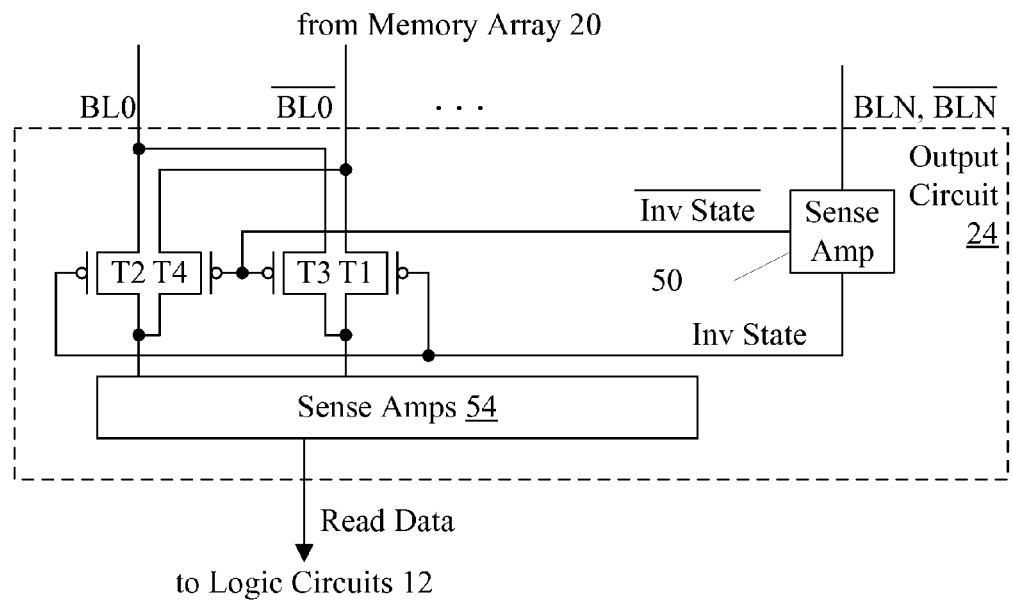
FIG. 4 is a block diagram of another embodiment of an output circuit shown in FIG. 2.

Turning now to FIG. 4, a block diagram of another embodiment of a portion of the output circuit 24 is shown. In the embodiment of FIG. 4, a sense amp 50 may be coupled to receive bit line and bit line bar from column "N" of the memory array 20, which may be the column storing the inversion state in this embodiment. The sense amp 50 may amplify the differential to full logic swing, but may still provide a differential output of inversion state (Inv State) and the complement of the inversion state (Inv State bar). The inversion state is coupled to the gate terminal of P-type metal-oxide-semiconductor (PMOS) transistors T1 and T2. The complement of the inversion state is coupled to the gate terminal of PMOS transistors T3 and T4. The transistors T1 and T4 have sources coupled to the bit line bar for column zero (BL0 bar in FIG. 4), and the transistors T2 and T3 have sources coupled to the bit line for column zero (BL0 in FIG. 4). Similar sets of transistors may be coupled to the bit line and bit line bar for other columns.

The drains of the transistors T2 and T4 are coupled together and provide the "bit line" input to the sense amps 54 (i.e. the positive sense of the differential bit lines).

The drains of the transistors T1 and T3 are coupled together and provided the "bit line bar" input to the sense amps 54 (i.e. the negative sense of the differential bit lines). The sense amps 54 sense the bit to be output based on these inputs. In the case that the inversion state indicates no inversion (Inv state is low, and thus the transistors T1 and T2 are active), the bit line is coupled to the "bit line" input of the sense amps 54 and the bit line bar is coupled to the "bit line bar" input of the sense amps 54. The sense amps 54 thus sense the value stored in the memory cells 16, and output the value as the read data to the logic circuits 16. On the other hand, in the case that the inversion state indicates inversion (Inv state bar is low, and thus the transistors T3 and T4 are active), the bit line bar is coupled to the "bit line" input of the sense amps 54 and the bit line is coupled to the "bit line bar" input of the sense amps 54. The sense amps 54 thus sense the complement of the value stored in the memory cells 16, and output the complement as the read data to the logic circuits 16.

Effectively, the transistors T1 to T4 may swap the bit line and bit line bar for each bit of the data output from the memory array 40, accomplishing the correction of the read data in the case that the stored data is the complement of the actual data. In some embodiments, a memory circuit may include two or more banks of memory arrays similar to the memory array 20. In such an embodiment, a given read or write may access one bank and other banks are idle. A set of sense amps 54 may be shared among the banks, and column muxing may be implemented to select which bit line and bit line bar (from which bank) is input to the sense amps 54. The bit line swapping implemented via the transistors T1 to T4 may be integrated into the column muxing circuitry.

In one embodiment, a structure similar to the transistors T1 to T4 may be used in the write drivers portion of the input circuit 22 to effectively swap bit line and bit line bar to write true or complement data to the memory array 20.

In embodiments in which a global inversion state is maintained for the memory array 20, the inversion state and its complement may be coupled to the PMOS transistors as shown in FIG. 4, and the sense amp 50 may be omitted.

It is noted that, while PMOS transistors are used in the illustrated embodiment, other embodiments may use other transistors (e.g. N-type MOS, or NMOS, transistors). In an NMOS embodiment, the connection of the Inv State and Inv State bar signals to the transistors may be reversed (since NMOS transistors become active in response to positive gate to source voltages, not negative gate to source voltages such as PMOS transistors).

Turning now to FIG. 5, a block diagram of another embodiment of the memory circuit 14A is shown. The embodiment of FIG. 5 includes the memory control circuit 18 (including the aging control circuit 26 optionally coupled to the registers 28 and/or 30), the input circuit 22, the memory array 20, and the output circuit 24 generally coupled similar to the embodiment of FIG. 2. However, in this embodiment, the memory circuit 14A may implement partial inversion of the data in the memory array 20 on a column-by-column basis. Accordingly, the memory array 20 may include an additional row to store the inversion state for each column (inversion state row 60 in FIG. 5). The memory cells 16 within the inversion state row 60 may be coupled to the bit line and the bit line bar in their respective columns, but may also be directly coupled to the output circuit 24. The output circuit 24 may control the inversion of the data bit read from each column in a bitwise fashion using the data from the inversion state row 60. Alternatively, the inversion state may be stored in the register 30 (e.g. as a bit vector with each bit position corresponding to a column).

The output circuit 24 may, in some embodiments, be similar to the embodiment of FIG. 3 except that the mux 44 may be separated into one mux per bit, with the inversion state for the column providing the selection control for that bit. The output circuit 24 may, in other embodiments, be similar to the embodiment of FIG. 4 with the Inv State and Inv State Bar being provided from the respective memory cell 16 of the inversion state row 60. In still another embodiment each bit of the read data may be the exclusive OR of the bit from the row being read and the inversion state from that column. The input circuit 22 may also have access to the inversion state in the inversion state row 60, to selectively invert write data bits for each column based on the inversion state for that column.

Figure 6:
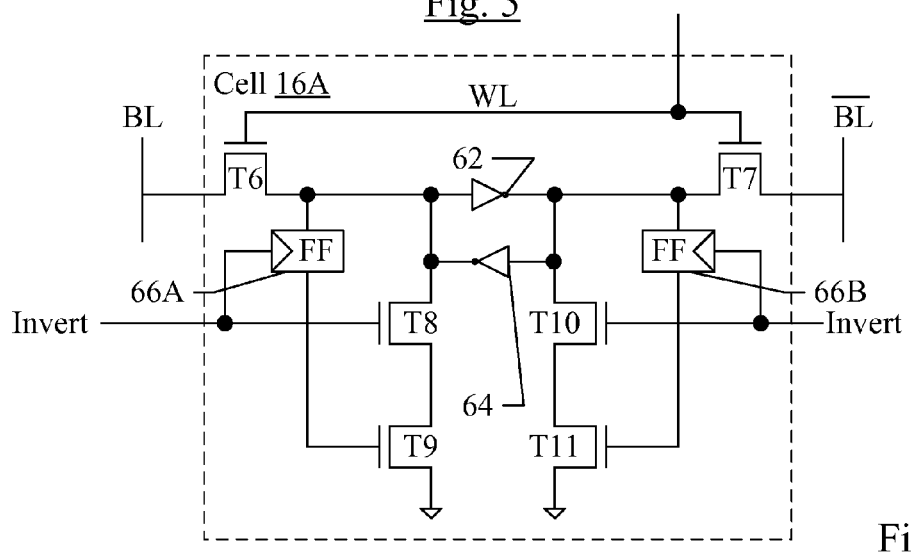
FIG. 6 is a circuit diagram of one embodiment of a cell that may be used in some embodiments of the memory circuit shown in FIGS. 2 and/or 5.

As mentioned previously, in some embodiments, the memory control circuit 18 may perform a read-modify-write of data in the memory array 20 to perform the inversion when an interval expires. In other embodiments, the memory cells 16 may include embedded circuitry that inverts the contents of the memory cell in response to a control signal. FIG. 6 is a circuitry diagram illustrating an exemplary embodiment of embedding the inversion circuitry in a memory cell 16A. The embodiment of FIG. 6 illustrates a six transistor (6 T) SRAM cell comprising cross-coupled inverters 62 and 64 and pass transistors T6 and T7 coupled between the cross-coupled inverters 62 and 64 and the bit line and bit line bar. The transistors T6 and T7 are activated via an assertion of the word line (WL) signal for the cell 16A.

Additionally, the memory cell 16A includes flip-flop (FF) circuits 66A-66B and transistors T8, T9, T10, and T11. The transistors T8 and T9 are coupled in series between the output of the inverter 64 and ground (or $V_{SS}$). The transistors T10 and T11 are coupled in series between the output of the inverter 62 and ground. The gate terminals of the transistors T8 and T10 are coupled to an invert control signal (which may be sourced from the aging control circuit 26). The gate terminals of transistors T9 and T11 are coupled to the outputs of the FF circuits 66A-66B, respectively, which have their inputs coupled to the outputs of the inverters 64 and 62, respectively. The FF circuits 66A-66B are clocked by the invert signal, in this embodiment, and are rising-edge triggered.

In response to the assertion of the invert signal by the aging control circuit 26, the transistors T8 and T10 may activate. The FF circuits 66A-66B may capture the current state of the cell 16A, and may output the state to the transistors T9 and T11, respectively. One of the transistors T9 or T11 may be active based on the bit stored in the cell 16A, as captured by the FF circuits 66A-66B. For example, if the bit is a binary one, the output of the FF circuit 66A is a binary one and the transistor T9 is active. If the bit is a binary zero, the output of the FF circuit 66B is a binary one and the transistor T11 is active.

In the case that the cell 16A is storing a binary one, T9 is active. The transistors T8 and T9 drain charge from the output of the inverter 64, eventually causing the input of the inverter 62 to be low enough to transition the output of the inverter 62 high. The output of the inverter 64 transitions low, and the cell state is inverted. Similarly, in the case that the cell 16A is storing a binary zero, T11 is active. The transistors T10 and T11 drain charge from the output of the inverter 62, eventually causing the input of the inverter 64 to be low enough to transition the output of the inverter 64 high. The output of the inverter 62 transitions low, and the cell state is inverted.

To provide robustness and reliability in the cell 16A, the FF circuits 66A-66B may prevent a race condition between the inverting of the state in the cell 16A and a subsequent "re-inversions" that might occur if the feedback between the transistors T9 and T11 and the current state of the cell 16A was not broken. While flip-flops are used in FIG. 6, other embodiments may use other devices that ensure that only one inversion takes place for a given assertion of the invert signal. For example, one flip-flop could be used (e.g. the FF circuit 66A), and its output could be inverted and supplied to the gate of the transistor T11 in addition to a non-inverted output being supplied to the gate of the transistor T9. In some embodiments, in may be desirable to delay the invert signal to the transistors T8 and T10 (as compared to the invert signal to the clock input of the FF circuits 66A-66B) to permit the FF circuits 66A-66B to change state prior to the transistors T8 and T10 activating.

While the embodiment of FIG. 6 illustrates non-inverting FF circuits 66A-66B, other embodiments may implement inverting FF circuits 66A-66B. In such embodiments, the output of the FF circuit 66A may be coupled to gate terminal of the transistor T11 and the output of the FF circuit 66B may be coupled to gate terminal of the transistor T9.

Figure 7:
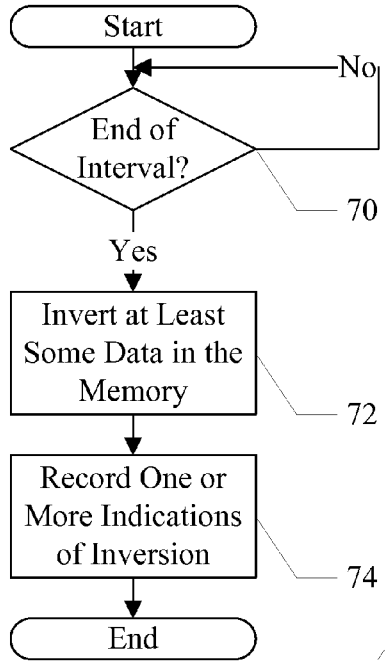
FIG. 7 is a flowchart illustrating operation of one embodiment of an aging control circuit shown in FIGS. 2 and/or 5.

Turning now to FIG. 7, a flowchart is shown illustrating operation of one embodiment of the memory circuit 14A (and more particularly, the aging control circuit 26, in the embodiments of FIG. 2 or 5) to periodically invert the data stored in the memory array 20. While the blocks are shown in a particular order for ease of understanding, other orders may be used. Blocks may be performed in parallel in combinatorial logic circuitry in the memory circuit 14A/aging control circuit 26. Blocks, combinations of blocks, and/or the flowchart as a whole may be pipelined over multiple clock cycles. Generally, the memory circuit 14A/aging control circuit 26 may be configured to implement the operation shown in FIG. 7.

The memory circuit 14A/aging control circuit 26 may be configured to determine if an interval of time for changing the inversion state has expired (decision block 70). The interval may be measured via the timer in the register 28, or in some other fashion. As mentioned previously, the interval may be one the order of hours, a day, more than one day, etc. The interval may also be at the boot of the device including the integrated circuit 10. In some embodiments, the interval may be affected by how busy the memory circuit 14A is (e.g. in terms of writes to the memory circuit 14A). In other embodiments, the interval may be measured in software and the decision block 70 may be replaced by a communication from software (e.g. a register write) indicating a request for inversion.

If the interval has expired (decision block 70, "yes" leg), the memory circuit 14A/aging control circuit 26 may be configured to invert at least some of the data stored in the memory array 20 (block 72). For example, in some embodiments, the memory circuit 14A/aging control circuit 26 may be configured to invert the next row or the next column of the memory array 20. In other embodiments, the inversion state may be global and the memory control circuit 14A/aging control circuit 26 may invert all the data stored in the memory array 20. The inversion may be performed using one or more read/modify/write operations issued internal to the memory circuit 14A, or may be performed using embedded inversion circuitry such as the embodiment of FIG. 6. The read/modify/write operations may comprise a read access performed using a read port (either one of the read ports that are available for the logic circuits 12 to use, or via a dedicated read port for the aging control circuit 26, in various embodiments), inversion of the read data in the aging control circuit 26, and a write access performed using a write port to write the inverted data back to the memory array 20 (either one of the write ports that are available for the logic circuits 12 to use, or a dedicated write port for the aging control circuit 26).

Additionally, the memory circuit 14A/aging control circuit 26 may record one or more indications of the inversion (block 74). For example, the inversion state for the row or column may be changed, if a row or column is being inverted. If the inversion state is global, the inversion state may be modified in the inversion state register 30.

Figure 8:
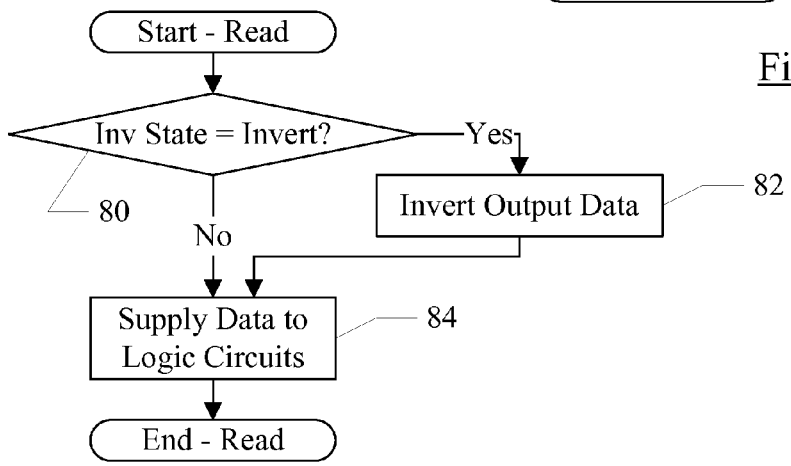
FIG. 8 is a flowchart illustrating operation of one embodiment of a memory for a read operation.

Turning now to FIG. 8, a flowchart is shown illustrating operation of one embodiment of the memory circuit 14A (and more particularly, the output circuit 24, in the embodiments of FIG. 2 or 5) in response to a read access. While the blocks are shown in a particular order for ease of understanding, other orders may be used. Blocks may be performed in parallel in combinatorial logic circuitry in the memory circuit 14A/output circuit 24. Blocks, combinations of blocks, and/or the flowchart as a whole may be pipelined over multiple clock cycles. Generally, the memory circuit 14A/output circuit 24 may be configured to implement the operation shown in FIG. 8.

The memory circuit 14A/output circuit 24 may be configured to examine the inversion state(s) associated with the data being read (decision block 80). In various embodiments, the inversion state may be the inversion state associated with the row, the inversion states associated with each column in the row, or the global inversion state for the memory array 20. If the inversion state indicates that the data is inverted (or stored in complement form—decision block 80, "yes" leg), the memory circuit 14A/output circuit 24 may be configured to invert the output data from the memory array 20 (block 82). The inversion may be performed on the data as a whole (e.g. if the inversion state is global or maintained on a row-by-row basis) or selectively on a bit-by-bit bases (e.g. if the inversion state is maintained on a column-by-column basis). The memory circuit 14A/output circuit 24 may be configured to supply the data as the read data for the read access (block 84).

Figure 9:
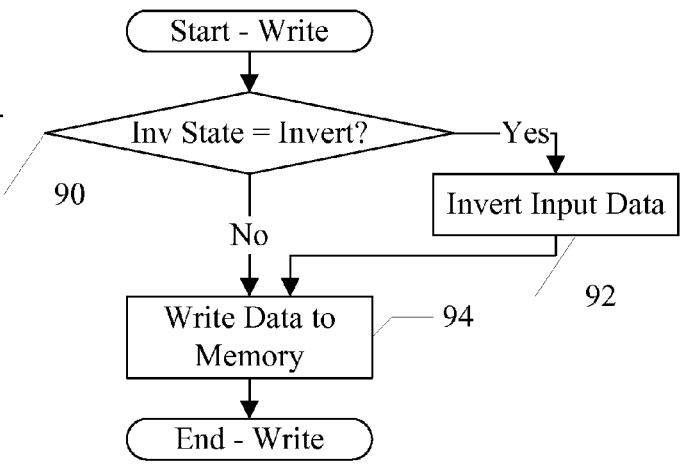
FIG. 9 is a flowchart illustrating operation of one embodiment of a memory for a write operation.

Turning now to FIG. 9, a flowchart is shown illustrating operation of one embodiment of the memory circuit 14A (and more particularly, the input circuit 22, in the embodiments of FIG. 2 or 5) in response to a write access. While the blocks are shown in a particular order for ease of understanding, other orders may be used. Blocks may be performed in parallel in combinatorial logic circuitry in the memory circuit 14A/input circuit 22. Blocks, combinations of blocks, and/or the flowchart as a whole may be pipelined over multiple clock cycles. Generally, the memory circuit 14A/input circuit 22 may be configured to implement the operation shown in FIG. 9.

The memory circuit 14A/input circuit 22 may be configured to examine the inversion state(s) associated with the data being written (decision block 90). In various embodiments, the inversion state may be the inversion state associated with the row, the inversion states associated with each column in the row, or the global inversion state for the memory array 20. In the case that the inversion state is stored in the memory array 20, the input circuit 22 may be coupled to receive the inversion state directly, or may read the inversion state associated with the location being written. If the inversion state indicates that the data is to be inverted (or stored in complement form—decision block 90, "yes" leg), the memory circuit 14A/input circuit 22 may be configured to invert the input data (block 92). The inversion may be performed on the data as a whole (e.g. if the inversion state is global or maintained on a row-by-row basis) or selectively on a bit-by-bit bases (e.g. if the inversion state is maintained on a column-by-column basis). The memory circuit 14A/input circuit 24 may be configured to write the data to the memory array 20 (block 94).

Figure 10:
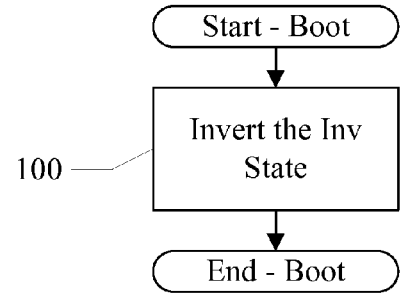
FIG. 10 is a flowchart illustrating operation of one embodiment of code executing during boot of a system including the integrated circuit shown in FIG. 1.

FIG. 10 is a flowchart is shown illustrating operation of one embodiment of the code that may execute during boot of a device that includes the integrated circuit 10. In some embodiments, the integrated circuit 10 may include one or more processors that are configured to execute the boot code. In other embodiments, one or more processors may be included elsewhere in the system to execute the boot code. Generally, the boot code may comprise one or more instructions which, when executed, implement the operation shown in FIG. 10. It is noted that the boot code may perform various other initializations in the integrated circuit 10 and/or other circuitry in the device, not shown in FIG. 10.

The boot code may invert the inversion state (block 100). That is, the boot code may read the current inversion state from a non-volatile memory, and may modify the inversion state to indicate the opposite state. The boot code may write the modified inversion state back to the non-volatile memory, and may program the memory circuits 14 with the inversion state (e.g. writing the register 30). Alternatively, the inversion state stored in the non-volatile memory may be used, and then the inversion state in the non-volatile memory may be modified.

System and Computer Accessible Storage Medium

Figure 11:
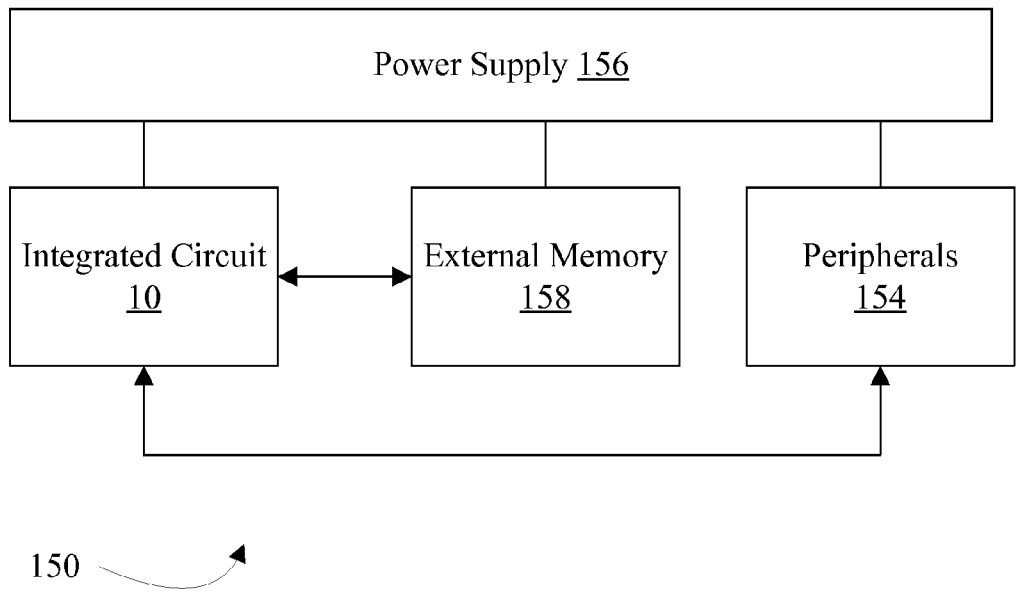
FIG. 11 is a block diagram of one embodiment of a system including the integrated circuit of FIG. 1.

Turning next to FIG. 11, a block diagram of one embodiment of a system 150 is shown. In the illustrated embodiment, the system 150 includes at least one instance of an integrated circuit 10 (from FIG. 1) coupled to one or more peripherals 154 and an external memory 158. The external memory 158 may include the memory from the main memory system 20. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Figure 12:
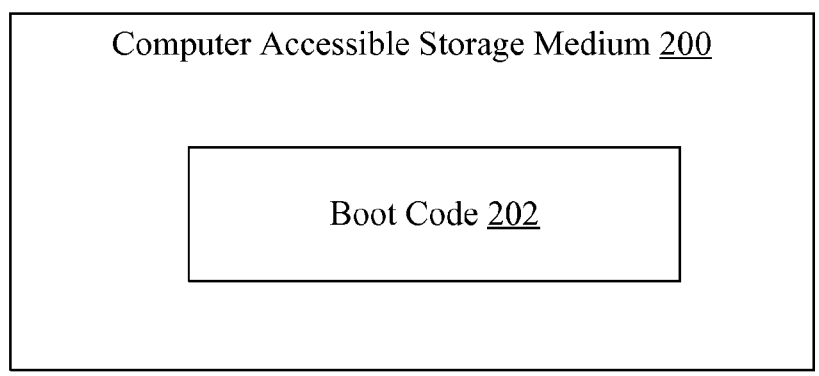
FIG. 12 is a block diagram of one embodiment of a computer accessible storage medium.

Turning now to FIG. 12, a block diagram of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link. The computer accessible storage medium 200 in FIG. 12 may store boot code 202, which may include the code described above with regard to FIG. 10. Generally, the computer accessible storage medium 200 may store any set of instructions which, when executed, implement a portion or all of the operation shown in FIG. 10. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:

1. A memory circuit comprising:
a memory array comprising a plurality of memory cells arranged as a plurality of rows and a plurality of columns, wherein each of the plurality of rows is selectable via an address input to the memory array; and
a control circuit configured to selectively invert data in the plurality of columns, wherein the memory array comprises an additional row of memory cells in the plurality of rows, and wherein the control circuit is configured to store a plurality of indications in the additional row of memory cells, wherein each of the plurality of indications corresponds to a respective column of the plurality of columns and indicates whether or not the data in the respective column is inverted whereby an inversion status of the data in the memory array is maintained on a column-by-column basis, and wherein the control circuit is configured to periodically modify the plurality of indications, and wherein each instance of the periodic modification of the plurality of indications changes only one of the plurality of indications corresponding to only one of the respective columns.

2. The memory circuit as recited in claim 1 further comprising an output circuit coupled to the memory array and configured to supply read data in response to a read operation in the memory circuit, wherein the output circuit is configured to invert one or more bits of data output from the memory array responsive to the plurality of indications from the additional row of memory cells.

3. The memory circuit as recited in claim 1 further comprising an input circuit coupled to the memory array and to receive write data being written to the memory array, wherein the input circuit is configured to invert one or more bits of write data in response to the plurality of indications from the additional row of memory cells.

4. A method comprising:
periodically modifying an inversion state corresponding to a memory array, wherein the inversion state indicates whether corresponding data in the memory array is stored in true form or in complement form, wherein the periodic modification preserves a symmetry of memory cells in the memory array, wherein the inversion state is maintained on the memory array as a whole, wherein the periodically modifying comprises inverting the inversion state; and
reading data from the memory array, wherein the reading comprises selectively inverting the data to recover original data responsive to the inversion state.

5. The method as recited in claim 4 further comprising writing data to the memory array, wherein the writing comprises selectively inverting write data to create inverted data to be stored in the memory array responsive to the inversion state.

6. The method as recited in claim 4 wherein the periodically modifying comprises modifying the inversion state each time a device including the memory array is booted.

7. The method as recited in claim 4 further comprising monitoring a write frequency to the memory array, wherein a period over which the modifying is performed is changed dependent on the write frequency.

8. The method as recited in claim 7 wherein the period is longer in response to higher write frequency.

9. A method comprising:
periodically modifying an inversion state corresponding to a memory array, wherein the inversion state indicates whether corresponding data in the memory array is stored in true form or in complement form, wherein the periodic modification preserves a symmetry of memory cells in the memory array, wherein the inversion state is maintained on a row-by-row basis, and wherein the periodically modifying comprises modifying the inversion state to change an inversion status for one row; and
reading data from the memory array, wherein the reading comprises selectively inverting the data to recover original data responsive to the inversion state.

10. The method as recited in claim 9 further comprising inverting data stored in the one row for which the inversion status is changed.

11. A method comprising:
periodically modifying an inversion state corresponding to a memory array, wherein the inversion state indicates whether corresponding data in the memory array is stored in true form or in complement form, wherein the periodic modification preserves a symmetry of memory cells in the memory array, wherein the inversion state is maintained on a column-by-column basis, and wherein the periodically modifying comprises modifying the inversion state to change an inversion status for one column; and
reading data from the memory array, wherein the reading comprises selectively inverting the data to recover original data responsive to the inversion state.

12. The method as recited in claim 11 further comprising inverting data stored in the one column for which the inversion status is changed.

13. The method as recited in claim 4 further comprising inverting data stored in an entirety of the memory array responsive to the periodically modifying.

14. A memory circuit comprising:
a memory array comprising a plurality of memory cells arranged as a plurality of rows and a plurality of columns, wherein each of the plurality of rows is selectable via an address input to the memory array; and
a control circuit coupled to the memory array and configured to maintain an inversion state for the memory as a whole, wherein the inversion state indicates whether or not the data stored in the memory array in true or complement form, and wherein the control circuit is configured to cause read data output from the memory array to be inverted to recover original data responsive to the inversion state indicating inverted, and wherein the control circuit is configured to cause write data input to the array to be inverted responsive to the inversion state indicating inverted, and wherein the control circuit is configured to periodically invert the inversion state.

15. The memory circuit as recited in claim 14 wherein the inversion state is inverted each time a device including the memory array is booted.

16. The memory circuit as recited in claim 14 wherein the control circuit is further configured to monitor a write frequency to the memory array, wherein a period over which the modifying is performed is changed dependent on the write frequency.

17. The memory circuit as recited in claim 16 wherein the period is longer in response to higher write frequency.

18. A computer accessible storage medium storing a plurality of instructions executable on a device that includes an integrated circuit including a memory circuit that stores either true or complement data dependent on a programmable indication, wherein the plurality of instructions, when executed during an initialization of the device, establish the programmable indication to select on opposite one of the true or complement than was selected in a preceding initialization, wherein consecutive initializations select opposite ones of the true or complement data storage.

19. The computer accessible storage medium as recited in claim 18 wherein the programmable indication is stored in a non-volatile memory, and wherein the plurality of instructions are configured to modify the programmable indication in the non-volatile memory and to program a configuration register in the memory circuit with the programmable indication.

\* \* \* \* \*